(12) United States Patent
Choi et al.

(10) Patent No.: US 7,741,774 B2
(45) Date of Patent: Jun. 22, 2010

(54) BACKLIGHT MODULE INCLUDING AT LEAST ONE LUMINESCENCE ELEMENT, AND METHOD OF FABRICATING THE SAME

(75) Inventors: Seung-tae Choi, Yongin-si (KR); Ki-hwan Kwon, Yongin-si (KR); Su-ho Shin, Yongin-si (KR); Ji-hyuk Lim, Yongin-si (KR); Chang-youl Moon, Yongin-si (KR); Kyu-ho Shin, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 550 days.

(21) Appl. No.: 11/605,295

(22) Filed: Nov. 29, 2006

(65) Prior Publication Data

US 2007/0290613 A1 Dec. 20, 2007

(30) Foreign Application Priority Data

Jun. 15, 2006 (KR) .................. 10-2006-0053925

(51) Int. Cl.
*H01J 1/62* (2006.01)
(52) U.S. Cl. ...................... 313/509; 313/506
(58) Field of Classification Search .......... 313/498–512
See application file for complete search history.

(56) References Cited

U.S. PATENT DOCUMENTS

| | | | | |
|---|---|---|---|---|
| 2005/0073846 A1* | 4/2005 | Takine | ................... | 362/296 |
| 2005/0156174 A1* | 7/2005 | Murakami et al. | ............ | 257/72 |
| 2006/0232199 A1* | 10/2006 | Takahashi | ................... | 313/504 |

FOREIGN PATENT DOCUMENTS

KR 2002-0069357 * 8/2002

* cited by examiner

*Primary Examiner*—Bumsuk Won
(74) *Attorney, Agent, or Firm*—Sughrue Mion, PLLC

(57) ABSTRACT

A method of fabricating a backlight module in which at least one luminescence element is positioned, including: positioning a luminescence element in at least one cavity formed on a carrier; forming a lower electrode on a substrate; transferring the luminescence element positioned on the carrier to the substrate, connecting the luminescence element to a pattern of the lower electrode formed on the substrate, and removing the carrier; forming an insulating layer on a surface of the substrate to which the luminescence element is transferred, and exposing a top region of the luminescence element; and forming an upper electrode on the exposed top region of the luminescence element. Accordingly, the backlight module including very small luminescence elements being of a micro unit in size is easily fabricated.

9 Claims, 8 Drawing Sheets

BACKLIGHT MODULE INCLUDING AT LEAST ONE LUMINESCENCE ELEMENT, AND METHOD OF FABRICATING THE SAME

CROSS-REFERENCE TO RELATED APPLICATIONS

This application claims priority from Korean Patent Application No. 10-2006-0053925, filed Jun. 15, 2006, in the Korean Intellectual Property Office, the entire contents of which are incorporated herein by reference.

BACKGROUND OF THE INVENTION

1. Field of the Invention

Apparatuses and method consistent with the present invention relate to a backlight module and a method of fabricating the same and, more particularly, to a backlight module including luminescence elements being of a micro unit in size and a method of fabricating the same.

2. Description of the Related Art

Generally, a liquid crystal display (LCD) is a device which displays various kinds of information but it does not include a self-luminescence element. Due to this reason, an LCD needs an additional device with luminescence elements, positioned at the rear of the display, to uniformly brightening the whole screen of the display. Such a device is a Back Light Unit (BLU). The BLU comprises a backlight module including luminescence elements, and a panel layer mixing light emitted from the backlight module and transferring the light to an LCD panel.

A backlight module used in the BLU includes a plurality of luminescence elements. As an example of the luminescence elements of the backlight module, a Light Emitting Diode (LED) is used. The LED backlight modules, which have been developed and used, include a plurality of luminescence elements being about 1 mm by 1 mm in size. A backlight module has to provide light in a certain amount or more. Thus, there is a problem in that a large number of LEDs should be used.

To solve the problem and to efficiently use luminescence elements, a method has been developed to distribute light emitted from luminescence elements to a large region, by additionally using an optical system such as lenses.

However, when an optical system such as lenses is additionally positioned within an LCD, a process becomes complicated and a manufacturing cost increases accordingly. Furthermore, since an optical system is additionally placed, there is a limit in reducing the thickness of the LCD. Furthermore, a loss of light occurs while the light is refracted by the optical system.

Furthermore, since a conventional backlight module is fabricated by mounting luminescence elements, one by one, on a substrate, the time required for the process of mounting all the luminescence elements is very long.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above. Accordingly, it is an aspect of the present invention to provide a backlight module and a method of fabricating the same, the backlight module including a number of very small luminescence elements having high brightness, thereby emitting light to a large region, without using any additional optical system.

It is another aspect of the present invention to provide a backlight module and a method of fabricating the same, the backlight module in which very small luminescence elements are positioned by the Fluidic Self-Assembly process, thereby reducing processing time and cost required for the luminescence element mounting and wire bonding.

The present invention provides a method of fabricating a backlight module including at least one luminescence element, comprising the steps of: (a) positioning a luminescence element in at least one cavity formed on a carrier; (b) forming a lower electrode on a substrate; (c) transferring the luminescence element positioned on the carrier to the substrate, connecting the luminescence element to the lower electrode which is formed on the substrate, and removing the carrier; (d) forming an insulating layer on a surface of the substrate to which the luminescence element is transferred, and exposing a top region of the luminescence element; and (e) forming an upper electrode on the exposed top region of the luminescence element.

In an exemplary implementation the step (a) may further comprise positioning the luminescence element in the at least one cavity formed on the carrier, by the Fluidic Self-Assembly process.

The step (b) may further comprise the steps of: forming an insulating material on the substrate; and forming a metal layer on the insulating material, patterning the metal layer, to form the lower electrode, and printing a solder on the lower electrode.

The step (b) may further comprise the steps of: forming an insulating material on the substrate; and forming a metal layer on the insulating material, and patterning the metal layer, to form the lower electrode and a pad to be connected to the upper electrode.

In this case, the step (d) may further comprise etching the insulating layer formed on the surface of the substrate to which the luminescence element is transferred, to expose the top region of the luminescence element and the surface of the pad.

In an exemplary implementation the step (e) may further comprise forming the upper electrode to connect the exposed region of the luminescence element and the exposed surface of the pad.

In an exemplary implementation the step (b) may further comprise connecting the luminescence element to the lower electrode by the solder.

In an exemplary implementation the at least one luminescence element may be about 100~300 μm in size.

In an exemplary implementation the at least one luminescence element may be formed in an irregular shape.

In an exemplary implementation the at least one luminescence element may be formed such that one side of the luminescence element is bigger than the other side in area, and an inclined side connecting both sides is at a predetermined angle.

In an exemplary implementation the insulating layer may comprise an SU-8 photo resist material.

In an exemplary implementation the upper electrode may comprise an indium tin oxide (ITO) material.

In an exemplary implementation at least any one of the insulating layer and the upper electrode may comprise a transparent material.

In accordance with another exemplary embodiment, the present invention provides a backlight module comprising: a substrate; a lower electrode formed on the substrate; at least one luminescence element connected to the lower electrode;

an insulating layer formed on an entire surface of the substrate including the at least one luminescence element; and an upper electrode formed on the insulating layer and connected to one side of the at least one luminescence element.

In an exemplary implementation the lower electrode may comprise: a first lower electrode positioned at a predetermined position on the substrate; a second lower electrode; and a third lower electrode.

In an exemplary implementation the at least one luminescence element may comprise: a red light emitting diode (LED) connected to any one of the first, second and third lower electrodes; a blue LED connected to another of the first, second and third lower electrodes; and a green LED connected to the other of the first, second and third lower electrodes.

In an exemplary implementation the backlight module may further comprise: a pad formed on the substrate; and a via hole penetrating the insulating layer and exposing the pad; and wherein the upper electrode is connected to the pad through the via hole.

In an exemplary implementation the at least one luminescence element may be connected to the lower electrode by a solder.

In an exemplary implementation the at least one luminescence element may be about 100~300 µm in size.

In an exemplary implementation the at least one luminescence element may be formed in an irregular shape.

In an exemplary implementation the insulating layer may comprise an SU-8 photo resist material.

In an exemplary implementation the at least one luminescence element may be formed such that one side of the luminescence element is bigger than the other side in area, and an inclined side connecting both sides is at a predetermined angle.

In an exemplary implementation the upper electrode may comprise an indium tin oxide (ITO) material.

In an exemplary implementation at least any one of the insulating layer and the upper electrode may comprise a transparent material.

BRIEF DESCRIPTION OF THE DRAWINGS

The above and/or other aspects of the present invention will become more apparent by describing in detail exemplary embodiments thereof with reference to the accompanying drawing figures, wherein.

DETAILED DESCRIPTION OF THE EXEMPLARY EMBODIMENTS

Hereinafter, exemplary embodiments of the present invention will be described in detail with reference to the accompanying drawing figures.

Figure 1:
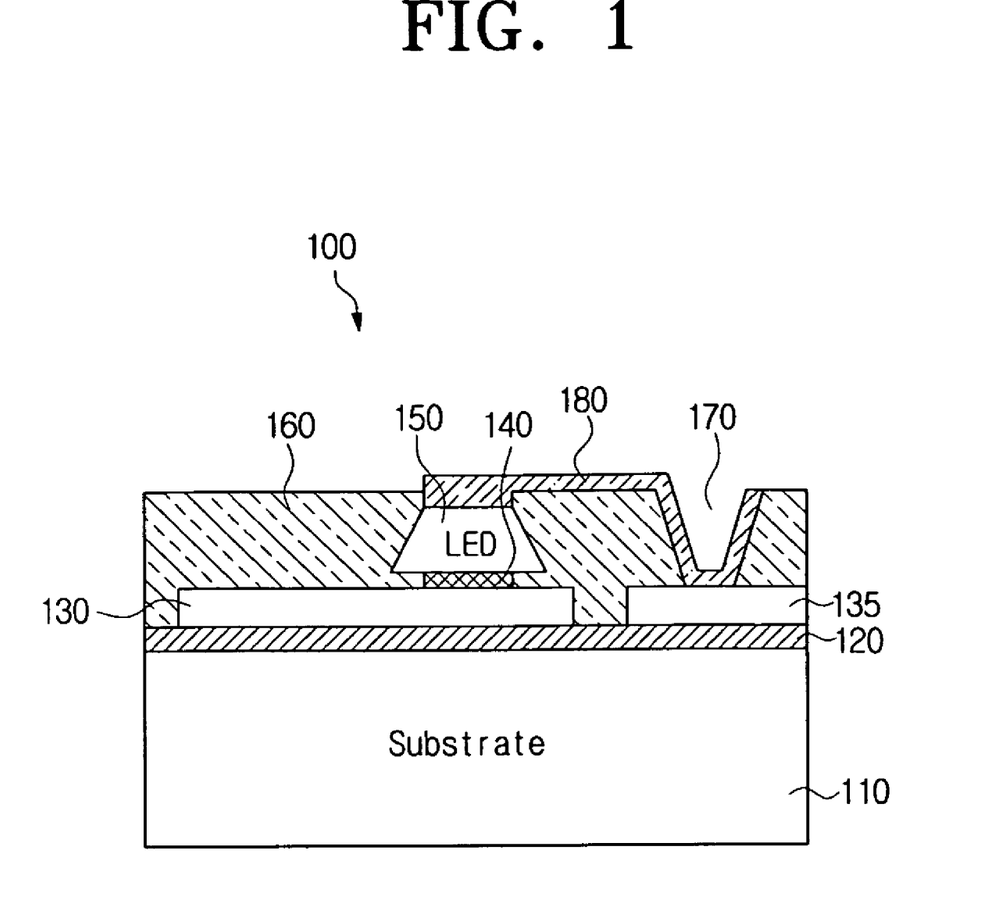
FIG. 1 is a vertical sectional view illustrating a part of a backlight module in accordance with an exemplary embodiment of the present invention.

FIG. 1 is a vertical sectional view illustrating a part of a backlight module 100 in accordance with an exemplary embodiment of the present invention. As illustrated in FIG. 1, the backlight module 100 comprises a substrate 110, an insulating material 120, a lower electrode 130, a junction layer 140, a luminescence element 150, an insulating layer 160, a via hole 170, and an upper electrode 180.

The insulating material 120 is formed on the substrate 110. The insulating material 120 electrically insulates the substrate 110 from the materials formed on the substrate 110. A polymer and a metallic oxide may be used as the insulating material 120. An aluminum oxide layer, which is formed on the substrate 110 through an anodizing process, may be also used as the insulating material 120.

The lower electrode 130 is formed on the insulating material 120 on the substrate 110. In addition to the lower electrode 130, a pad 135 to be connected to the upper electrode 180 may be formed on the insulating material 120 on the substrate 110. Specifically, the lower electrode 130 and the pad 135 are formed by forming a metal layer on the insulating material 120 and then patterning the metal layer. The lower electrode 130 contacts with one side of the luminescence element 150 so that the lower electrode 130 is electrically connected to the luminescence element 150.

The junction layer 140 for connecting the lower electrode 130 to the luminescence element 150 is formed on a region of the lower electrode 130. In this case, the luminescence element 150 may be connected to the lower electrode 130, using a solder material. The luminescence element 150 is positioned in a cavity formed on a carrier (not shown), by the Fluidic Self-Assembly process. The luminescence element 150 positioned on the carrier is transferred to the substrate 110, for connection.

The luminescence element 150 is formed in a very small size of a micro unit. Specifically, the size of the luminescence element 150 may be formed within a range of 100 ~300µm. The luminescence element 150 of p-n junction structure may have a p-region on one side, and n-region the other side, and vice versa. That is, when one side includes a p-region, then the other side includes an n-region. Thus, when the luminescence element 150 is positioned on the carrier by the Fluidic Self-Assembly process, it is preferable but not necessary that, for correct distinction of polarity, both sides of the luminescence element 150 be formed in a different shape or area. In FIG. 1, the luminescence element 150 is formed in a shape such that the top side of the luminescence element 150 is smaller than the bottom side thereof in area. Accordingly, the connection side for connecting the top side and the bottom side is at a predetermined inclination angle. The shape of the luminescence element 150 is not limited to FIG. 1, and thus it may be realized in a different shape.

FIG. 1 illustrates only one luminescence element but an actual backlight module includes a plurality of luminescence elements 150. Each luminescence element may be formed in a different shape, within the range of 100~300 µm. The luminescence element 150 may be a red, green or blue light emitting diode (LED).

When the luminescence element 150 is positioned on the substrate 110, the insulating layer 160 is formed on the entire surface of the substrate 110 including the lower electrode 130. In this case, the insulating layer 160 may comprise a transparent material. Accordingly, when the luminescence element 150 emits light, the light is transmitted through the insulating layer 160. An SU-8 photo resist material may be used as the insulating layer 160. When the insulating layer 160 is formed on the entire surface of the substrate 110, the via hole 170 is formed on the top side of the luminescence element 150 and the insulating layer 160 corresponding to the pad 135, so that the top side of the luminescence element 150 and the pad 135 are exposed.

The upper electrode 180 is formed on the top side of the luminescence element 150 and the pad 135 which are exposed through the via hole 170. The upper electrode 180 connects the top side of the luminescence element 150 and the pad 135. In this case, the upper electrode 180 may comprise a transparent material, so that the light emitted from the luminescence element 150 is transmitted outwardly. An indium tin oxide (ITO) electrode may be used as the upper electrode 180.

Figure 2:
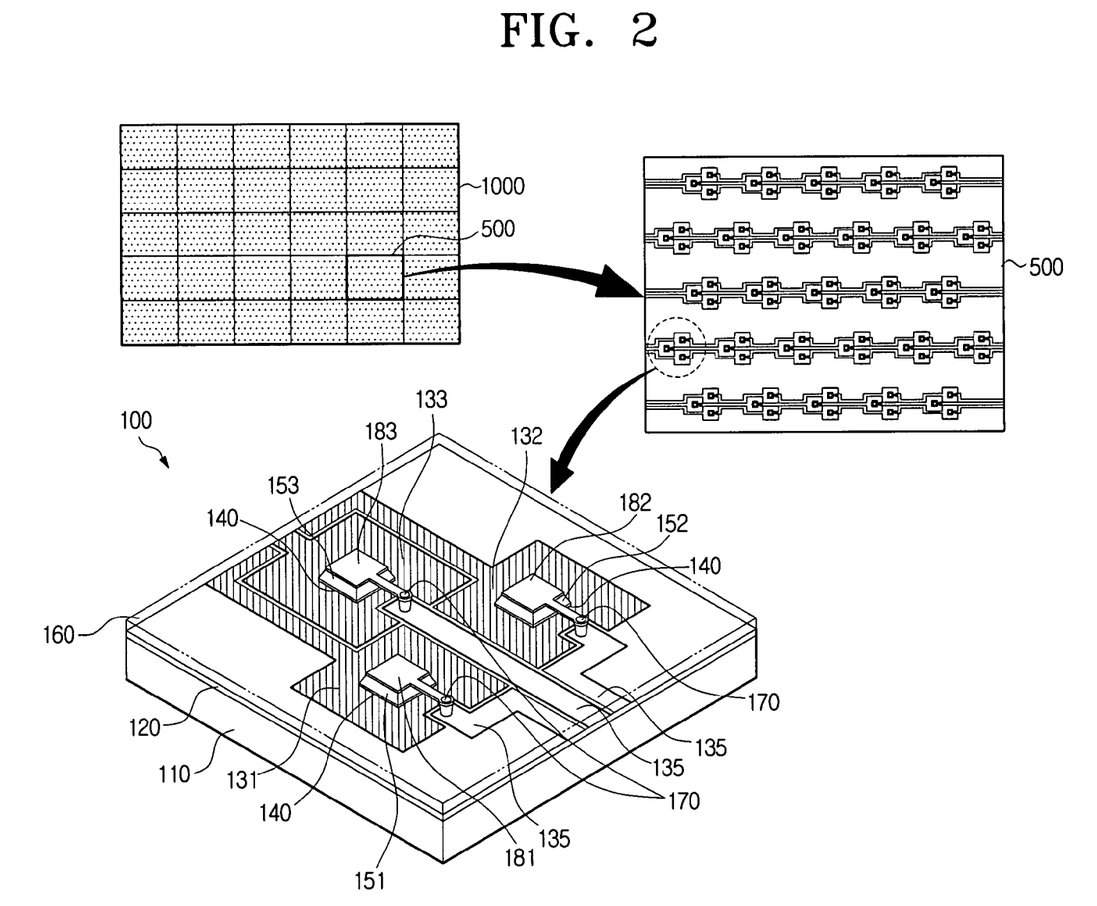
FIG. 2 is a perspective view illustrating a backlight module in accordance with another exemplary embodiment of the present invention.

FIG. 2 is a perspective view illustrating a backlight module 1000 in accordance with another exemplary embodiment of the present invention. As illustrated in FIG. 2, the entire backlight module 1000 is divided into a plurality of blocks 500. Each block 500 is divided into a plurality of luminescence element sets. Each luminescence element set may include three luminescence elements as shown in FIG. 2. Among a plurality of the luminescence element sets, the sectional view of one luminescence element set may be the same as illustrated in FIG. 1. A part of the whole backlight module 1000 illustrated in FIG. 2, i.e., one luminescence element set, indicates the backlight module 100 illustrated in FIG. 1.

The constitution of a backlight module 100 will be described in reference to FIGS. 1 and 2. The backlight module 100 comprises a substrate 110, an insulating material 120, a pad 135, lower electrodes 131, 132 and 133, a junction layer 140, a plurality of luminescence elements 151, 152 and 153, an insulating layer 160, a via hole 170, and upper electrodes 181, 182 and 183.

The substrate 110 is electrically insulated from the lower electrodes 131, 132 and 133 by the insulating material 120. The pad 135 in addition to the lower electrodes 131, 132 and 133 is formed on the substrate 110. The lower electrodes include a first lower electrode 131, a second lower electrode 132 and a third lower electrode 133. The junction layer 140 is formed on the lower electrodes 131, 132 and 133. A plurality of luminescence elements 151, 152 and 153 are electrically connected to the lower electrodes 131, 132 and 133 by the junction layer 140.

A first luminescence element 151 is positioned on the first lower electrode 131, a second luminescence element 152 is positioned on the second lower electrode 132, and a third luminescence element 153 is positioned on the third lower electrode 133. The luminescence elements 151, 152 and 153 are electrically connected to the lower electrodes 131, 132 and 133, respectively. The insulating layer 160 is formed throughout the entire surface of the substrate 110 to which the luminescence elements 151, 152 and 153 are connected. Each of the luminescence elements 151, 152 and 153 may be a red, green or blue LED.

As the via hole 170 is formed on the top sides of the luminescence elements 151, 152 and 153 and the insulating layer 160 corresponding to the pad 135, the top sides of the luminescence elements 151, 152 and 153 and the pad 135 are exposed. The upper electrodes 181, 182 and 183 are formed on the exposed top sides of the luminescence elements 151, 152 and 153 and the exposed pad 135.

The lower electrodes 131, 132 and 133 and the upper electrodes 181, 182 and 183 may be formed according to the characteristics of each luminescence element as formed. For example, in the LED using a p-n junction structure, when the bottom side of the LED is a p-region and the top side of the LED is a n-region, the lower electrodes 131, 132 and 133 have the positive (+) polarity and the upper electrodes 181, 182 and 183 have the negative (−) polarity. However, when the bottom side of the LED is a n-region and the top side of the LED is a p-region, the lower electrodes 131, 132 and 133 have the negative (−) polarity and the upper electrodes 181, 182 and 183 have the positive (+) polarity. Accordingly, the top and bottom sides of the LED are electrically connected to the upper and lower electrodes, to emit light.

In each luminescence element set 100 of the whole backlight module 1000, the luminescence elements having the constitution shown in FIG. 1 are formed simultaneously. A method of fabricating a backlight module will be described, in detail, below.

Figure 3A:
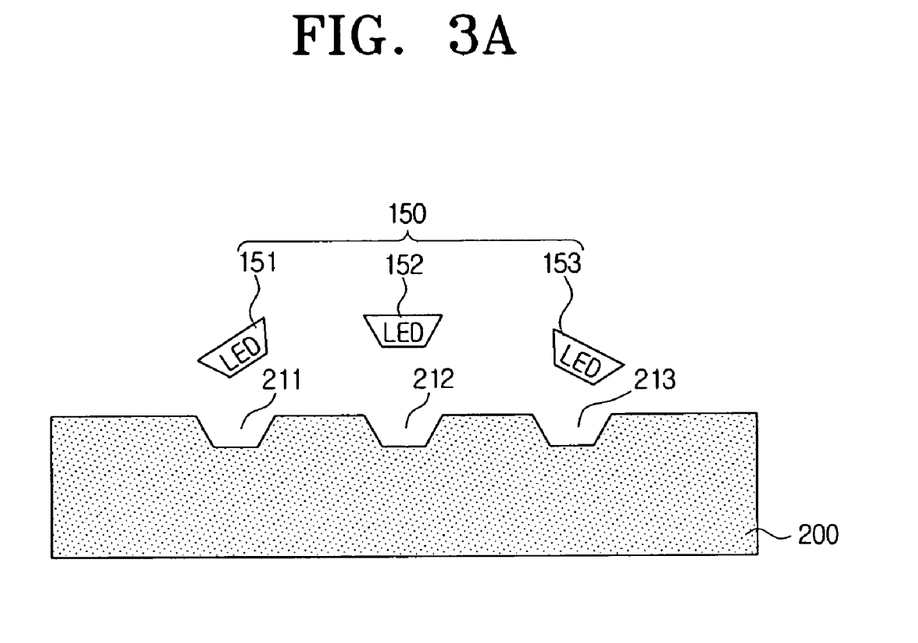
FIGS. 3A through 3I are vertical sectional views for explaining a method of fabricating a backlight module in accordance with another exemplary embodiment of the present invention.

FIGS. 3A through 3I are vertical sectional views for explaining a method of fabricating a backlight module in accordance with another exemplary embodiment of the present invention. As illustrated in FIG. 3A, a carrier 200 is provided with a plurality of cavities 211, 212 and 213 formed on its surface. The cavities 211, 212 and 213 are formed through a general etching process using a photo resist mask. In this case, the cavities 211, 212 and 213 are formed in a very small size, according to the size of each luminescence element. Luminescence elements 150 are respectively positioned at a plurality of the cavities 211, 212 and 213 formed on the carrier 200. In this case, luminescence elements 151, 152 and 153 are respectively positioned at the cavities 211, 212 and 213. Consequently, a plurality of luminescence elements 151, 152 and 153 are simultaneously positioned on the carrier 200.

The luminescence elements 151, 152 and 153 are respectively attached to the cavities 211, 212 and 213 formed on the carrier 200, by the Fluidic Self-Assembly process. The Fluidic Self-Assembly process, developed by Alien Technology Corporation of the USA, is generally used when fabricating the tags and chips of Micro Electro Mechanical Systems (MEMS). In this process, Nanoblock chips flow through a liquid solution and are attached to a film with holes into which the chips settle. Since the Nanoblock chips are capable of recognizing shape, the chips fall into the holes with the shape corresponding to the shape of the chips. In the Fluidic Self-Assembly process, it is not necessary to position a great quantity of chips, one by one. Thus, processing time and processing costs are reduced. Using the Fluidic Self-Assembly process, each luminescence element is positioned at each of the cavities 211, 212 and 213, thereby reducing the processing time and cost.

Each luminescence element is formed in a different shape, within a range of about 100~300μm in size. The cavities 211, 212 and 213 to which the luminescence elements 151, 152 and 153 are respectively attached are formed according to the size of the luminescence elements 151, 152 and 153. In this case, the size of each cavity may be bigger by 1-2% of the size of the corresponding luminescence element. The angle of an inclined side may be bigger by 1~3 degrees, thereby permitting easier and faster attachment of the luminescence elements on the carrier, which will be described in detail below.

Figure 3B:
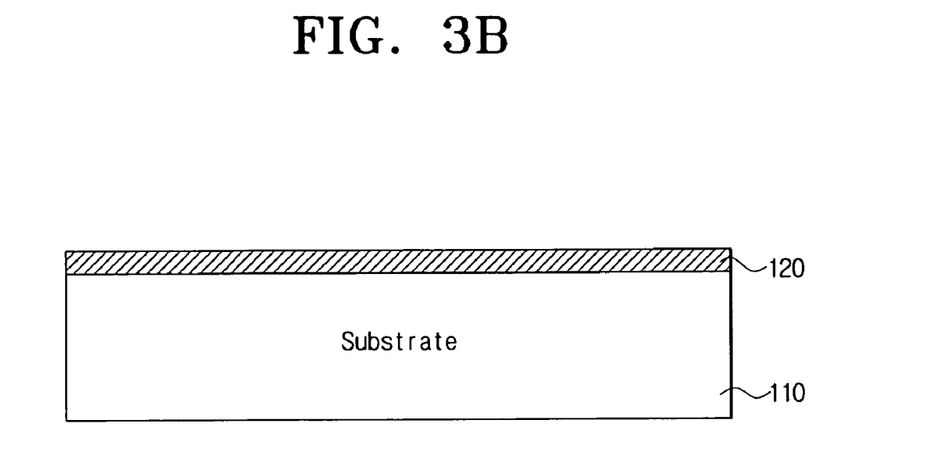

As illustrated in FIG. 3B, an insulating material 120 is formed on a substrate 110. A polymer, a metallic oxide and an aluminum oxide layer may be used as the insulating material 120.

Figure 3C:
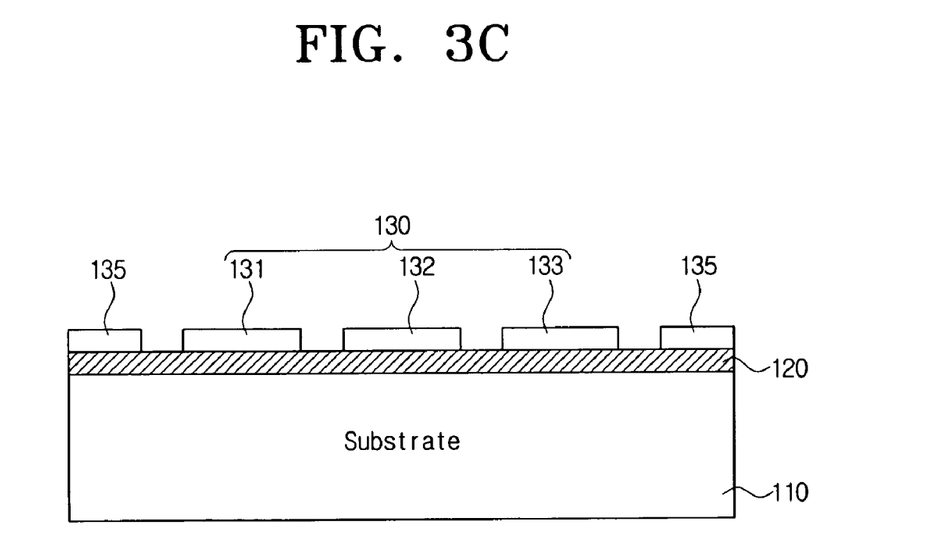

As illustrated in FIG. 3C, a lower electrode 130 is formed on the insulating material 120. Specifically, after a metal layer is formed on the insulating material 120, the metal layer is etched in a predetermined pattern, thereby forming the lower electrode 130. The position and pattern of the lower electrode 130 may be varied according to a state in which the luminescence elements 151, 152 and 153 of the backlight module are aligned.

When the lower electrode 130 is formed, a pad 135 may be formed together therewith. That is, a pattern corresponding to the pad 135 is also formed during the process of etching the metal layer.

Figure 3D:
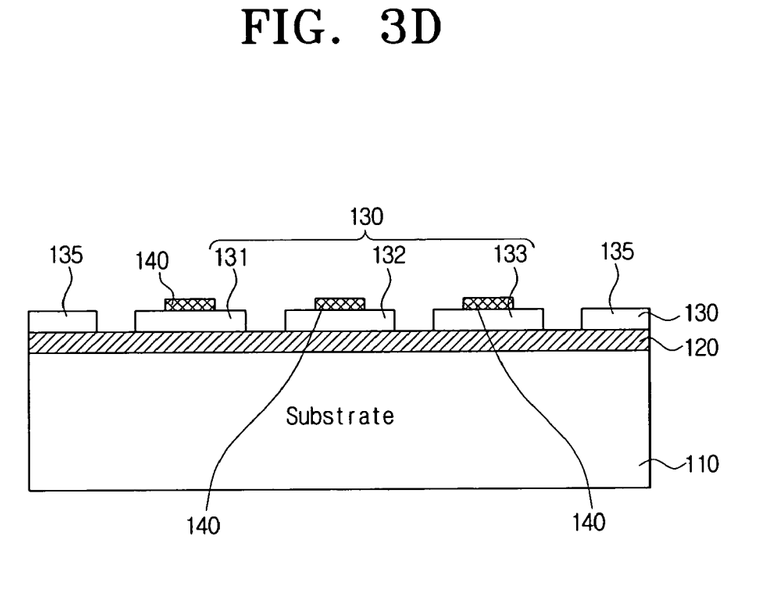

As illustrated in FIG. 3D, a junction layer 140 is formed at a region of the lower electrode 130 to which the luminescence elements 151, 152 and 153 are connected, by a solder printing process. In this case, the lower electrode 130 is connected to the luminescence elements 151, 152 and 153 by a solder.

Figure 3E:
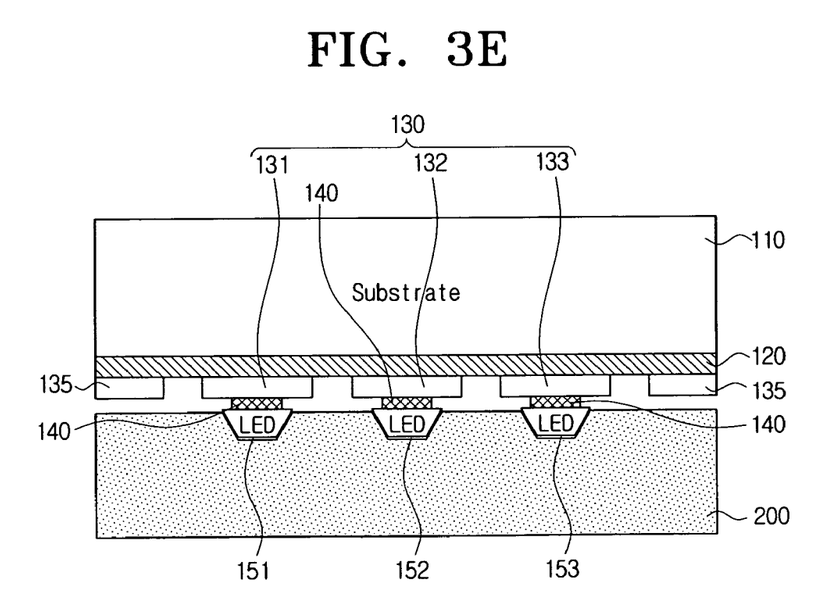

As illustrated in FIG. 3E, the luminescence elements 151, 152 and 153 positioned on the carrier 200 are transferred to the substrate 110. That is, the upper surface of the substrate 110, where the insulating material 120, the lower electrode 130 and the junction layer 140 are formed, is connected to the surface of the carrier, where the luminescence elements 151, 152 and 153 are positioned, while maintaining the carrier 200. When the luminescence elements 151, 152 and 153 are connected to the junction layer 140, the carrier 200 is removed. Consequently, the luminescence elements 151, 152 and 153 are electrically connected to the lower electrode 130 through the junction layer 140. This is called a transferring process.

Figure 3F:
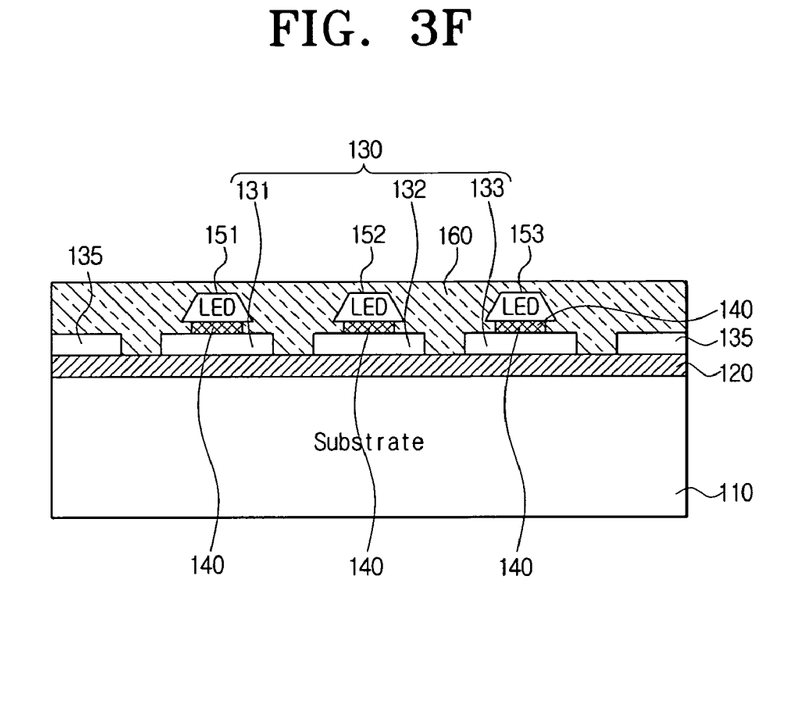

As illustrated in 3F, an insulating layer 160 is formed on the whole substrate 110. In this case, an SU-8 photo resist material may be used as the insulating layer 160.

Figure 3G:
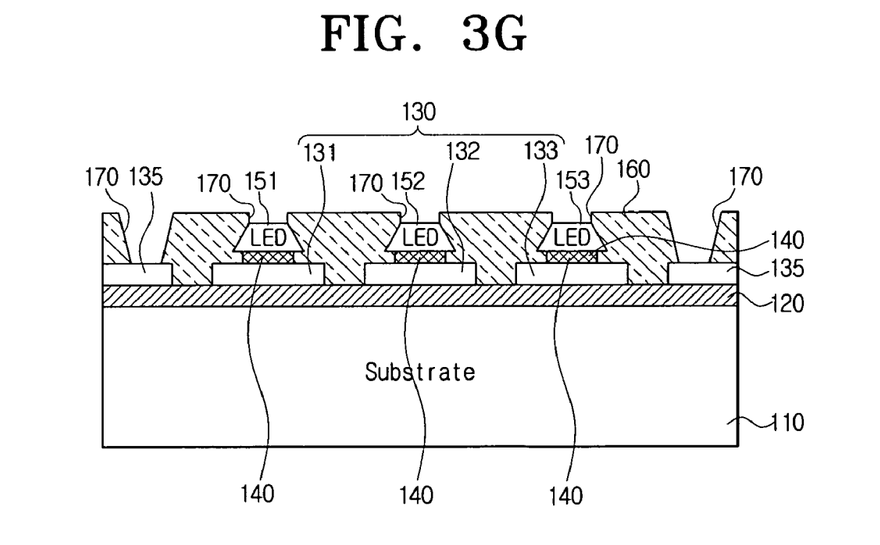

As illustrated in 3G, a via hole 170 is formed on the top side of the luminescence elements 151, 152 and 153 and the insulating layer 160 in the region corresponding to the pad 135, thereby exposing the top side of the luminescence elements 151, 152 and 153 and the pad 135.

Figure 3H:
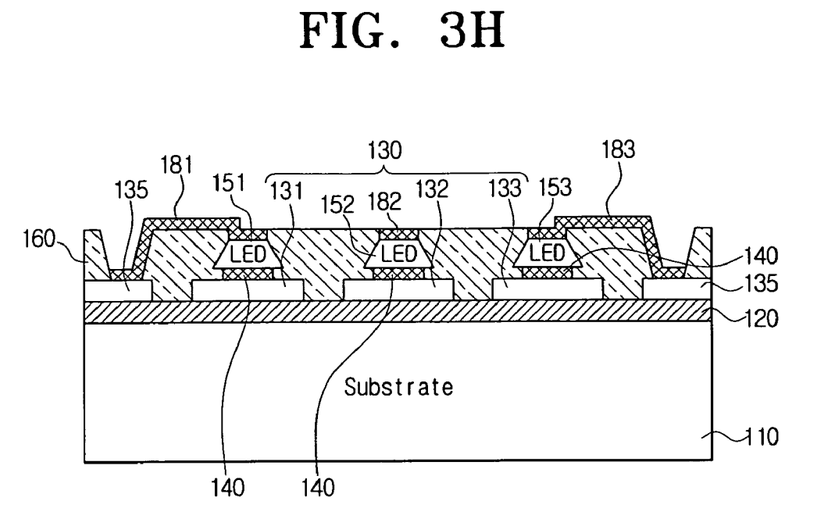

Subsequently, as illustrated in 3H, upper electrodes 181, 182 and 183 comprising a transparent material are formed on the exposed top side of the luminescence elements 151, 152 and 153 and the exposed pad 135.

Figure 3I:
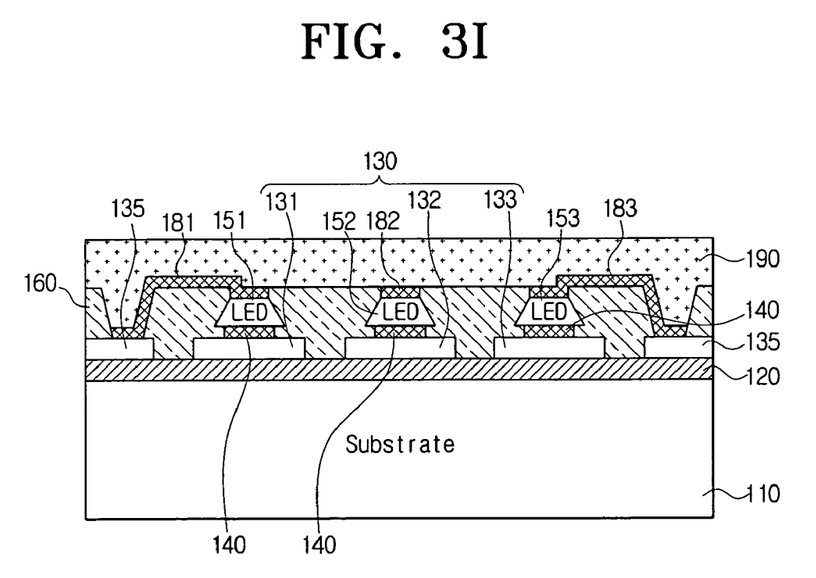

The upper electrodes 181, 182 and 183 may be formed using an indium tin oxide (ITO) electrode. When the upper electrodes 181, 182 and 183 formed of the transparent material are formed on the top side of the luminescence elements 151, 152 and 153, the loss of light is reduced, compared to the connection method such as wire bonding. The upper electrodes 181, 182 and 183 may be differently formed, as illustrated in FIGS. 3H and 3I. That is, in FIGS. 3H and 3I, the upper electrodes 181, 182 and 183 are formed to be connected to an external electrode through the pad 135 on the substrate 110. However, the upper electrodes 181, 182 and 183 may be formed to be connected to the external electrode, along the surface of the insulating layer 160. In this case, the via hole 170 in FIG. 3G does not need to be formed.

As illustrated in FIG. 3I, a capping material 190 is formed on the surface of the insulating layer 160 on which the upper electrodes 181, 182 and 183 are formed, thereby covering the upper electrodes 181, 182 and 183 and the insulating layer 160, so that the backlight module is completed.

The whole backlight module 1000 of FIG. 2 may be fabricated simultaneously, using the carrier 200 including the same number of cavities as the number of the luminescence elements 151, 152 and 153. That is, a carrier is provided with the position and number of cavities corresponding to the position and number of the luminescence elements 151, 152 and 153 of the whole backlight module 1000 of FIG. 2. Then, the luminescence elements 151, 152 and 153 are positioned at the carrier. The patterns of the lower electrodes 131, 132 and 133 on the substrate 110 are formed so as to correspond to the position and number of the luminescence elements 151, 152 and 153. The luminescence elements 151, 152 and 153 on the carrier are transferred to the substrate 110 so that the luminescence elements 151, 152 and 153 are connected to the upper electrode 181, 182 and 183, thereby fabricating the whole backlight module 1000. In this case, instead of fabricating the whole backlight module 1000 simultaneously, each of the blocks 500 of the whole backlight module 1000 may be formed according to the methods in FIGS. 3A through 3I and integrated to complete the entire backlight module 1000.

Figure 4:
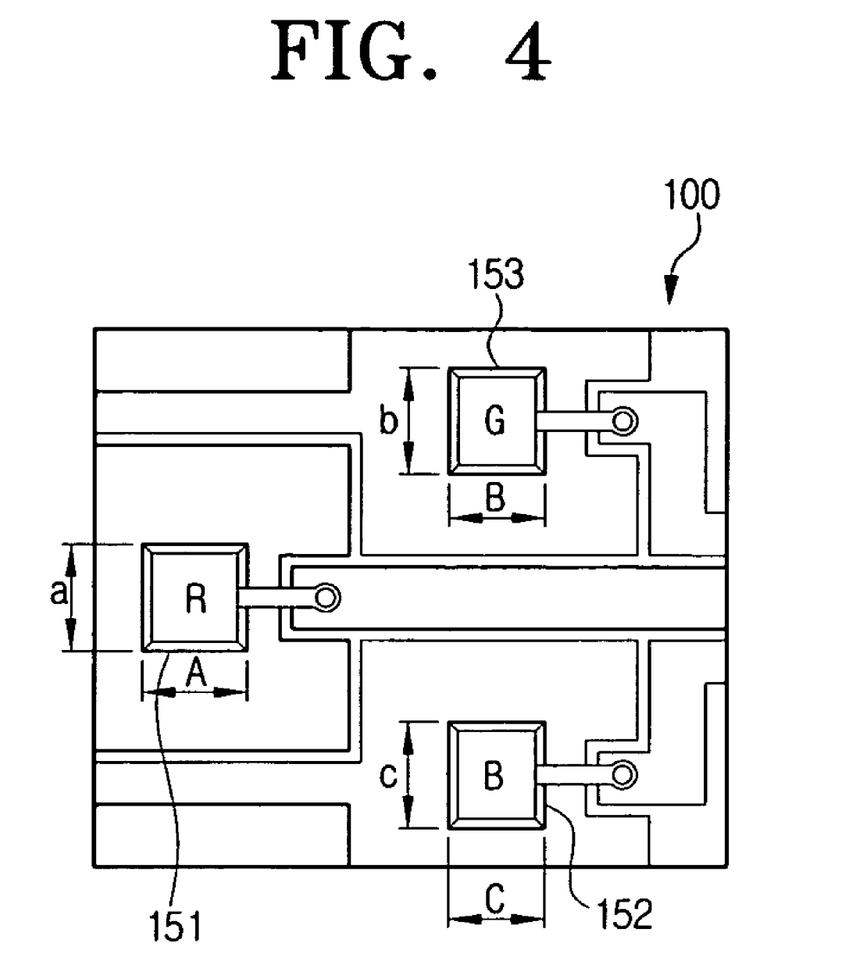
FIG. 4 is a view illustrating an example of a shape of each luminescence element in the backlight module of FIG. 2.

FIG. 4 is a view illustrating an example of the shape of each of the luminescence elements 151, 152 and 153 in the backlight module 100 of FIG. 2. As illustrated in FIG. 4, the width of the luminescence elements 151, 152 and 153 is respectively indicated as A, B and C, and the length thereof is respectively indicated as a, b and c. In this case, the width is different from one another, i.e., A>B>C, and the length is different from one another, i.e., a<b<c, thereby preventing each luminescence element from being wrongly positioned during the Fluidic Self-Assembly process. The shape of each luminescence element is not limited to a square as shown. Therefore, it may be realized in a different shape.

As described above, the backlight module in accordance with the exemplary embodiments of the present invention includes a number of very small luminescence elements being of a micro unit in size. Consequently, light is emitted in a large region, without any additional optical apparatus, thereby reducing the thickness of a display device.

Furthermore, in the backlight module in accordance with the exemplary embodiments of the present invention, a plurality of luminescence elements are positioned through the Fluidic Self-Assembly process, thereby reducing the processing steps and costs caused by the luminescence element mounting and the wire bonding.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A backlight module comprising:
a substrate;
a plurality of pads formed on the substrate;
a plurality of lower electrodes formed on the each of the pads;
a plurality of luminescence elements connected to the plurality of lower electrodes;
an insulating layer formed on an entire surface including parallel surfaces of the substrate, the plurality of the lower electrodes, and the plurality of luminescence elements, wherein part of the insulating layer is etched so that one side of the at least one luminescence element is exposed;
via holes through the insulating layer that are connected with at least some of the plurality of pads;
a plurality of upper electrodes formed on the plurality of the luminescence elements; and,
a capping material formed on the surfaces of the insulating layer and the plurality of the upper electrodes,
wherein at least one of the plurality of upper electrodes extends into at least one of the via holes, and
one end of each of the plurality of upper electrodes extends so as to be connected to each of the plurality of pads.

2. The backlight module as claimed in claim 1, wherein the plurality of lower electrodes comprises:
a first lower electrode positioned at a predetermined position on the substrate;
a second lower electrode; and
a third lower electrode.

3. The backlight module as claimed in claim 2, wherein at least one the plurality of luminescence elements comprises:
- a red light emitting diode (LED) connected to any one of the first, second and third lower electrodes;
- a blue LED connected to another of the first, second and third lower electrodes; and
- a green LED connected to the other of the first, second and third lower electrodes.

4. The backlight module as claimed in claim 1, wherein each of the plurality of luminescence elements is connected to at least one of the plurality of lower electrodes by a solder.

5. The backlight module as claimed in claim 1, wherein each of the plurality of luminescence elements is formed in a different shape.

6. The backlight module as claimed in claim 1, wherein the insulating layer comprises a photo resist material.

7. The backlight module as claimed in claim 1, wherein at least one the plurality of luminescence elements is formed such that one side of the luminescence element is bigger than the other side in area, and an inclined side connecting both sides is at a predetermined angle.

8. The backlight module as claimed in claim 1, wherein each of the plurality of upper electrodes comprises an indium tin oxide (ITO) material.

9. The backlight module as claimed in claim 1, wherein at least one of the insulating layer and the plurality of upper electrodes comprises a transparent material.

* * * * *